US006952664B1

(12) United States Patent
Lahiri et al.

(10) Patent No.: US 6,952,664 B1
(45) Date of Patent: Oct. 4, 2005

(54) SYSTEM AND METHOD FOR PREDICTING CACHE PERFORMANCE

(75) Inventors: Tirthankar Lahiri, Santa Clara, CA (US); Juan R. Loaiza, Redwood City, CA (US); Arvind Nithrakashyap, San Mateo, CA (US); William H. Bridge, Alameda, CA (US)

(73) Assignee: Oracle International Corp., Redwood Shores, CA (US)

( * ) Notice: Subject to any disclaimer, the term of this patent is extended or adjusted under 35 U.S.C. 154(b) by 925 days.

(21) Appl. No.: 09/834,342

(22) Filed: Apr. 13, 2001

(51) Int. Cl.[7] ............................................. G06G 17/50
(52) U.S. Cl. ........................... 703/14; 703/13; 703/17; 703/21; 717/128; 711/118
(58) Field of Search .............................. 703/13, 14, 17; 717/128; 711/118

(56) References Cited

U.S. PATENT DOCUMENTS

| | | | | |
|---|---|---|---|---|
| 5,845,106 A | * | 12/1998 | Stapleton | 703/21 |
| 5,910,900 A | * | 6/1999 | Mangelsdorf | 703/6 |
| 5,940,618 A | * | 8/1999 | Blandy et al. | 717/128 |
| 6,096,089 A | * | 8/2000 | Kageshima | 703/18 |
| 6,263,302 B1 | * | 7/2001 | Hellestrand et al. | 703/17 |
| 6,301,641 B1 | * | 10/2001 | Verhoeven et al. | 711/118 |

OTHER PUBLICATIONS

"Trace-Driven Memory Simulation: A Survey", R.A. Uhlig et al, ACM Computing Surveys, vol. 29, No. 2, Jun. 1997.*
"Automatic and Efficient Evaluation of Memory Hierarchies for Embedded Systems", S. Abraham et al, Hewlett-Packard #HPL 1999-132, Oct. 1999.*
"Active Memory: A New Abstraction for Memory system Simulation", A.R. Lebeck et al, ACM Transactions on Modeling and Computer Simulation, vol. 7, No. 1, Jan. 1997.*
"Retargetable Cache Simulation Using High Level Processor Models", R. Ravindran et al, IEEE 0-7695-0954-1/01, IEEE Jan. 2001.*
"Trace-Driven Memory Simulation: A Survey", R.V. Uhlig et al, ACM Computing Surveys, vol. 29, No. 2, Jun. 1997.*

* cited by examiner

*Primary Examiner*—Jean R. Homere
*Assistant Examiner*—Fred Ferris
(74) *Attorney, Agent, or Firm*—Park, Vaughan & Fleming LLP

(57) ABSTRACT

A system and methods for simulating the performance (e.g., miss rate) of one or more caches. A cache simulator comprises a segmented list of buffers, with each buffer configured to store a data identifier and an identifier of the buffer's segment. Data references, which may be copied from an operational cache, are applied to the list to conduct the simulation. Initial estimates of each cache's miss rate include the number of references that missed all segments of the list plus the hits in all segments not part of the cache. A correction factor is generated from the ratio of actual misses incurred by the operational cache to the estimated misses for a simulated cache of the same size as the operational cache. Final predictions are generated by multiplying the initial estimates by the correction factor. The size of the operational cache may be dynamically adjusted based on the final predictions.

17 Claims, 6 Drawing Sheets

SYSTEM AND METHOD FOR PREDICTING CACHE PERFORMANCE

BACKGROUND

This invention relates to the fields of computer systems and data processing. More particularly, a system and methods are provided for predicting the performance of a cache, as measured by a suitable metric such as the cache's miss rate.

When a cache is used to speed users' access to shared data, the amount of available memory is often the determining factor in selecting the cache size. System managers or database administrators usually do not have the tools to tune or resize the cache to the demands of a typical workload. Thus, memory may be wasted if the cache is too large, or excessive input/output operations may be incurred if the cache is too small.

To determine whether a cache is allocated sufficient memory, different cache sizes may be tested under actual operating conditions in a lengthy trial and error process. Caches of different sizes may be implemented and their performances noted for comparison. Suitable measures of performance may include a cache's hit rate or miss rate, which indicate how frequently the cache is found to include or omit, respectively, referenced data items. Prolonged or repeated testing, however, may adversely affect operation of the data processing system, as some cache implementations will be too generous and waste memory on the cache, while others will be too stingy and result in an undesirable level of input/output operations.

Alternatively, predictions may be generated for a particular cache size, based on the performance of a baseline cache for a given workload. For example, based on a number or ratio of hits or misses in a baseline cache of a given size, it may be expected that a proportionally adjusted number of hits/misses may result from a particular increase or decrease in size. Such extrapolations may, however, be very inaccurate.

Simulations of caches of different sizes may be performed, although typically each simulation can only simulate the performance of one cache size. Although simulations sometimes offer more accurate predictions, they can add a great deal of overhead to the operation of a data processing system, which may be an unacceptable trade-off. To predict the operation of multiple caches (e.g., of different sizes), multiple simulations may be required, thereby increasing the impact on an operational environment.

Yet further, even if a more suitable or optimal cache size is identified through an existing method of prediction, data processing operations (e.g., a database management system) may need to be halted and restarted in order to implement the different size.

SUMMARY

Therefore, in one embodiment of the invention a system and methods are provided for simultaneously predicting the performance of caches of multiple different sizes through a simulation that has only minimal impact on an operational data processing system. The results of the simulation may be applied to dynamically change the size of an operational cache to match the size of a simulated cache having a better predicted performance (e.g., fewer misses).

In an embodiment of the invention in which an operational buffer cache of a database management system (DBMS) caches data to facilitate access to shared data, references received by the operational cache (e.g., from user processes and/or database processes) are saved in memory in a trace buffer. Periodically, a simulation process removes references from the trace buffer and applies them to the simulated caches. Statistics are generated during simulation to track the number of hits and/or misses in the simulated caches and may be used to produce predicted performances (e.g., miss rates) for the different cache sizes and a given stream of references.

In this embodiment, the simulated caches are represented by a segmented list of simulated buffers that is manipulated according to a least recently used (LRU) algorithm. The number of buffers in the list may be determined by the size of the largest cache to be simulated. Each buffer is configured to store a data item reference or identifier (e.g., a data block address) and the number of the segment in which the buffer is located. The number of simulated caches may be determined by the number of segments in the list, or vice versa. A first (e.g., smallest) simulated cache comprises the first segment at the head of the list, the next larger cache comprises the first and second segments, the next larger cache adds the third segment, and so on. The tail of the list marks the end of the final segment, which may coincide with the boundary of the last (e.g., largest) simulated cache.

When an entry from the trace buffer is applied to the simulated caches, it counts as an absolute miss if the referenced data item is not referenced in any of the buffers in the list, in which case a counter of misses is incremented. Also, a buffer is unlinked from the tail of the list, populated with the data reference and inserted at the head of the list. Then the segment numbers of any buffers that migrated across segment boundaries (e.g., because of the buffer insertion) are updated. When application of a trace buffer entry results in a hit, a counter tracking the number of hits in the corresponding segment is incremented, the buffer is re-inserted at the head of the list, and segment numbers are updated as necessary.

After a desired number of trace buffer entries are applied to the list, for each simulated cache an initial estimate of the number of misses for the cache is computed by adding the number of absolute misses and the number of hits in every segment that is not part of the cache. A correction factor is calculated from the ratio of the number of misses incurred by the operational cache, for the same data references, to the initial estimate of misses for a simulated cache of the same size as the operational cache (e.g., as measured by the number of buffers in each cache). Each initial estimate is then multiplied by the correction factor to yield a final predicted miss rate.

DETAILED DESCRIPTION

Figure 1:
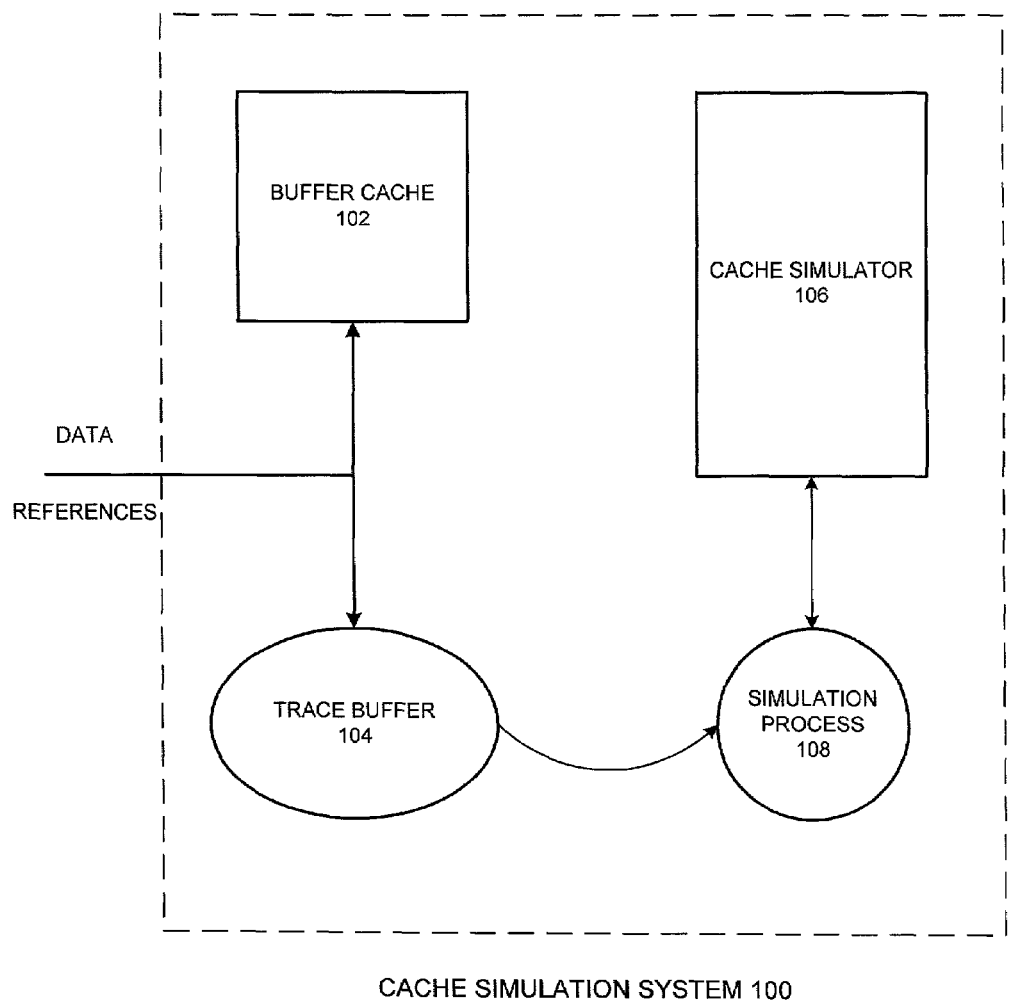
FIG. 1 is a block diagram depicting a system for predicting cache performance in accordance with an embodiment of the present invention.

The following description is presented to enable any person skilled in the art to make and use the invention, and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The program environment in which a present embodiment of the invention is executed illustratively incorporates a general-purpose computer or a special purpose device such as a hand-held computer. Details of such devices (e.g., processor, memory, data storage, display) may be omitted for the sake of clarity.

It should also be understood that the techniques of the present invention might be implemented using a variety of technologies. For example, the methods described herein may be implemented in software executing on a computer system, or implemented in hardware utilizing either a combination of microprocessors or other specially designed application specific integrated circuits, programmable logic devices, or various combinations thereof. In particular, the methods described herein may be implemented by a series of computer-executable instructions residing on a storage medium such as a carrier wave, disk drive, or computer-readable medium. Exemplary forms of carrier waves may take the form of electrical, electromagnetic or optical signals conveying digital data streams along a local network or a publicly accessible network such as the Internet.

In one embodiment of the invention a system and methods are provided for predicting the performance of multiple caches of different sizes by simulating their performance under a given workload (e.g., a set of data references copied from or applied in an operational environment). The multiple caches are simultaneously modeled by a segmented cache, which may take the form of a linked list of cache buffers. A first segment at the head of the list corresponds to the first (i.e., smallest) simulated cache, with each successively larger cache being represented by the combination of the previous (next smaller) cache plus the next segment. The number of buffers in the list may therefore equal the size of the largest cache to be simulated.

More particularly, the segmented cache is configured to model or simulate N LRU (Least Recently Used) caches, having sizes $size_1$, $size_2$, ... $size_N$. If $C_s(i)$ represents the contents of a cache of size s after processing reference number i in a stream of data references, then $$C_{size1}(i) \subseteq C_{size2}(i) \subseteq C_{sizeN}(i),$$

meaning that the contents of a given simulated cache will include the contents of each smaller simulated cache. This "stack" property exhibited by LRU replacement schemes may not be available with some other replacement policies, such as FIFO (First-In, First-Out).

In this embodiment, the data references are then applied to the simulated caches by a simulation process. The simulation may be particularly accurate in predicting the performance of the caches for an operational system if the data references used in the simulation are copied from an operational system over the course of a typical work cycle. During the simulation the system keeps track of the number of absolute misses—references to data items not stored in any segment of the segmented cache—as well as the number of hits within each segment.

An initial or preliminary estimate of the performance of a simulated cache is then determined, as measured by the total number of misses that would have resulted from using a cache of its size for the references. This initial estimate may comprise the number of absolute misses plus the sum of hits in each segment that is not included in the simulated cache. More specifically, a reference counts as a miss for a given cache if the referenced data item is not referenced in any of the buffers in the list or if it was a hit in a segment that is not included in the given cache.

The initial estimate for a cache may then be corrected to produce an adjusted prediction of the performance of the cache by multiplying the estimate by a correction factor. Illustratively, a correction factor used in a present embodiment of the invention may comprise the ratio of actual misses incurred by an operational cache for the set of data references used in the simulation to the number of misses incurred by a simulated cache of the same size (e.g., containing the same number of buffers) as the operational cache.

In one embodiment of the invention, the adjusted predictions may then be compared to the actual performance (i.e., number of misses) yielded by the operational cache, and the size of the operational cache may be dynamically modified to match the size of a simulated cache that yielded a better predicted performance.

FIG. 1 depicts a cache simulation system according to one embodiment of the invention. Illustratively, cache simulation system 100 is part of a database management system (DBMS) such as Oracle Server™, but may also be employed in virtually any type of environment that uses a cache to temporarily store data. In cache simulation system 100, data references are received (e.g., from user and/or database processes) at buffer cache 102 and are also copied to trace buffer 104. Periodically (or continuously), simulation process 108 removes accumulated references from trace buffer 104 and applies them to cache simulator 106. As explained further below, cache simulator 106 may comprise any number of simulated caches so that multiple caches of different sizes may be tested concurrently.

In the embodiment of FIG. 1, buffer cache 102 may be an operational buffer that is actually used to cache data during operation of the DBMS. In one alternative embodiment, the data references used for a simulation may be copied from a buffer cache external to the system, may have been stored from a previous period of operation of the buffer cache, or may be generated just for the purpose of cache simulation. Buffer cache 102 may be multiple gigabytes in size (e.g., two gigabytes), depending on the size of, and demand on, the DBMS.

Illustratively, trace buffer 104 is a circular buffer having a sufficient number of entries (e.g., one thousand) to ensure that an empty entry is always or almost always available to receive a new reference. In this embodiment, if the trace buffer is full when a new data reference is received for storage, the reference may be dropped instead of making the process that submitted the reference wait for an available entry to appear. This helps minimize the impact of the simulation on an operational environment. If a reference is dropped, it is still applied to buffer cache 102 as usual, but it is not added to trace buffer 104.

The data references stored in trace buffer 104 include at least an identifier of a data item sought by the submitting process. Thus, in the embodiment of FIG. 1, which is configured for DBMS operations, each reference may store an identifier of, or reference to, a data block address or some other means of identifying a data item on a storage device (e.g., disk drive, tape, compact disc).

Simulation process 108 may be configured to remove references from trace buffer 104 and apply them to cache simulator 106 on a periodic basis, whenever the trace buffer fills to a threshold level (e.g., one half), or on some other basis or schedule.

Operation of cache simulation system 100 is designed to have minimal impact on the DBMS or other data processing environment in which it is deployed (e.g., in terms of resource utilization). Illustratively, references are added to trace buffer 104 without holding any locks, even though the trace buffer is a shared resource, in order to reduce contention and keep the overhead low. Further, and as described below, lookups in cache simulator 106 during cache simulation can be done quickly by using a hash table.

Figure 2:
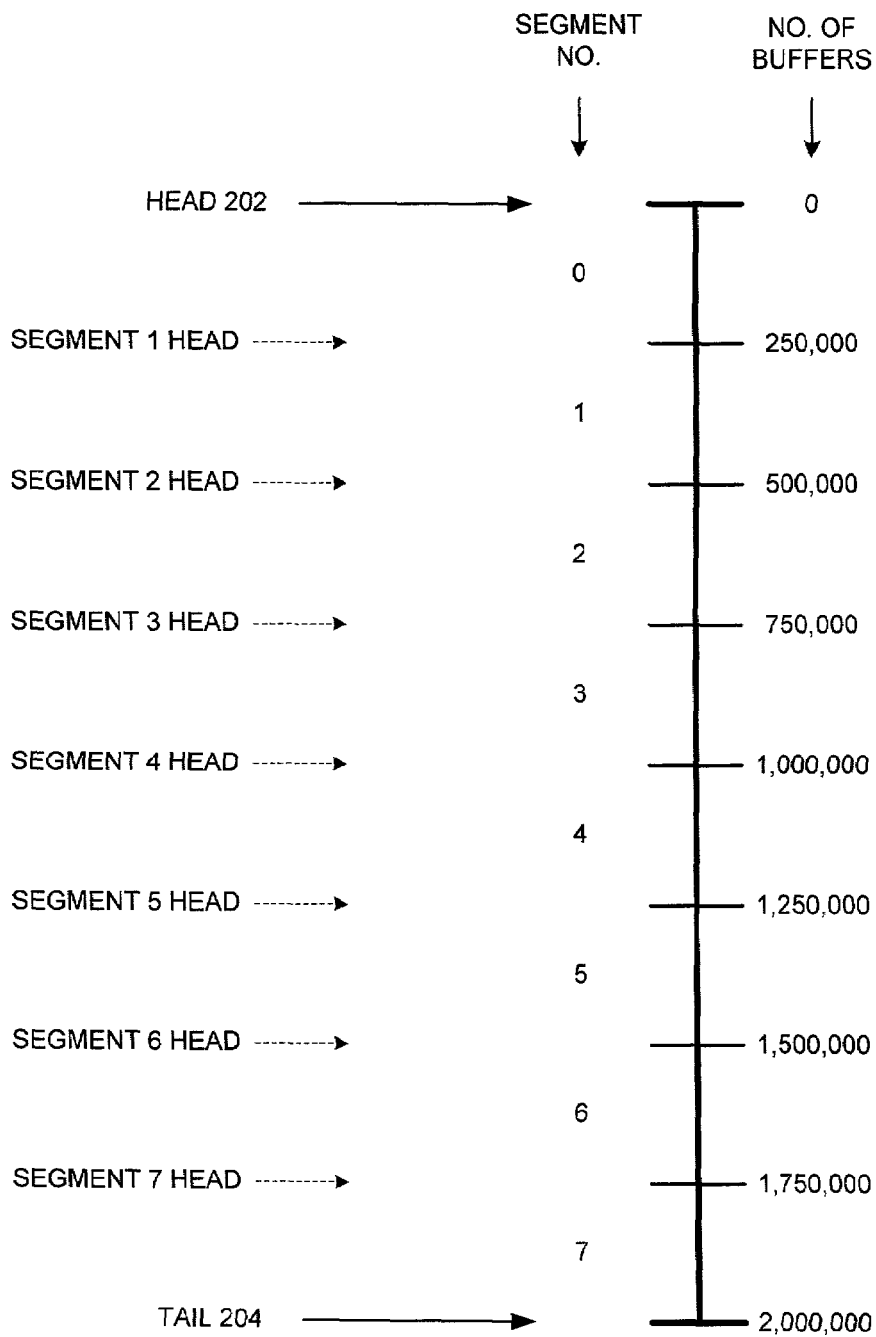
FIG. 2 is a diagram of a replacement list used to simulate multiple caches in accordance with an embodiment of the invention.

FIG. 2 depicts cache simulator 200 according to one embodiment of the invention. In this embodiment, simulator 200 may take the form of a segmented linked list comprised of simulated cache buffers. Head 202 points to or otherwise identifies the head of the list, while tail 204 identifies the tail. Illustratively, populated buffers are added at head 202, while new or obsolete buffers are taken from tail 204 to be populated and placed at the head when a new data reference is received.

Cache simulator 200 is segmented to allow simulation of multiple caches of different sizes. In the illustrated embodiment, each of the eight segments of cache simulator 200 is configured to hold 250,000 buffers, and the total number of buffers (i.e., two million) matches the size of the largest cache to be simulated. In other embodiments, segments need not be equal in size.

The eight segments of cache simulator 200 allow eight caches to be simulated, which may be designated cache0–cache7. The smallest cache, cache0, corresponds to just the first segment (i.e., segment 0). Cache1, the next larger cache, corresponds to the union of segment 0 and segment 1. The next larger cache includes segment 2, and so on, so that cache7 consists of segments 0 through 7. The number of segments and/or the size of a cache simulator may depend upon the number and size of caches a database administrator may wish to simulate. In cache simulator 200, optional segment pointers identify the head of each segment. The head of segment 0 coincides with head 202.

One of the simulated caches in cache simulator 200 (i.e., cache3) matches the size of the operational cache from which the data references used in the simulation were copied. As described below, this will allow the system to generate predicted cache performances with a greater focus on the operational environment. The other caches may correspond to a range of other sizes larger than and/or smaller than the operational cache.

In one embodiment of the invention a cache simulator is configured to automatically simulate twenty different cache sizes from one tenth to twice the size of the operational cache. The number and/or sizes of simulated caches may be selectable (e.g., by a database administrator) or may be preset in relation to an operational cache.

In an illustrative database environment in which a cache simulation system may be operated, the operational buffer cache may be two gigabytes in size and capable of storing one million buffers, with each buffer being approximate two kilobytes. Cache simulator 200 in this environment would then be approximately forty megabytes in size if each simulated buffer in the cache simulator is twenty bytes in size.

Operation of a cache simulator may be turned on or off dynamically (e.g., during database operations) by a database administrator, may be invoked as part of a database initialization procedure, etc. For example, an administrator may operate a simulation with cache simulator 200 during a typical work cycle for the DBMS and then turn it off afterwards. The predictions or estimated performances for the simulated caches may then be examined to determine if a more suitable cache size should be implemented for the type of work cycle that was used. If further simulations are desired (e.g., for different cache sizes, different workloads), the simulator may be restarted for another work cycle or the data references from a previous cycle may be saved and applied.

Each buffer in cache simulator 200 is populated with a data identifier (e.g., data block address) and the number of the segment in which the buffer is located. Head 202 of the cache simulator is located at the "hot" end of the simulated caches, which is where new or newly referenced buffers are inserted. Tail 204 identifies the other end of the simulated caches, from which buffers are taken to be populated with new data identifiers. In the embodiment of FIG. 2 the buffers that comprise the cache simulator may be logically arranged in a linked list; therefore, each buffer may also store one or more pointers or other identifiers of other buffers.

As described below, buffers migrate among the segments of cache simulator 200 depending on how frequently their data identifiers are targeted by data references retrieved from the trace buffer. In accordance with the LRU replacement algorithm under which cache simulator 200 operates, newly created or referenced buffers are placed at the head of the cache simulator. Whenever they migrate from one segment to another, their segment numbers are updated accordingly. When cache simulator 200 is initialized, each buffer is linked to its neighbor(s) and is populated with the segment number in which it is located. During the simulation the buffers receive the identifiers of data items they are to represent.

In one embodiment of the invention the buffers of cache simulator 200 may be stored as a hash table to facilitate rapid lookup of referenced data items. More particularly, each simulated buffer comprises two double links. One set links the buffer to its predecessor and successor in the hash chain, and the other set links it to its neighbors in the simulator. When a data reference is applied to the cache simulator, the identifier of the referenced data item (e.g., data block address) is hashed to find an index in the hash table. The chain leading from that index is then traversed to find the buffer that references the same data item (if it exists).

During simulation, each data reference (e.g., taken from a trace buffer) that is simulated is either a miss or a hit in cache simulator 200. A miss means that the data item is not referenced in any of the buffers of the cache simulator. A hit means that the data item is referenced in one of the buffers.

A miss therefore counts as a miss for each of the simulated caches and causes a counter that tracks the number of misses or physical reads to be incremented. This type of miss may be considered an absolute miss, because it missed every segment (and simulated cache) of cache simulator 200. The number of absolute misses tracked by the counter may be referred to herein as M. For each absolute miss, the bottom buffer of cache simulator (at tail 204) is unlinked, an identifier of the referenced data item is stored in the buffer, and the buffer is inserted at the top (at head 202).

Because this action causes the other buffers to be pushed down one position, the segment numbers of several buffers (i.e., the inserted buffer and those that are now at the head of each segment) are updated to indicate the segment into which they were pushed.

For a cache hit, a hit counter is incremented for the segment in which the data reference was located. Illustratively, an array of segment hits indexed by segment number may be maintained to keep track of hits. The buffer that caused the hit is then unlinked and inserted at the head of cache simulator 200 and the segment numbers of buffers are updated as necessary.

It should be understood that a hit for one segment of cache simulator 200 may represent a hit for more than one simulated cache. For example, every hit in segment 0 will count as a hit for cache0 as well as each of cache1–cache7, because segment 0 is part of every cache. In contrast, a hit in segment 7 will count as a hit only for cache7.

After all desired data references are applied to cache simulator 200, a set of statistics generated during the simulation is used to assemble preliminary or initial estimates of the performance of each simulated cache. In particular, the simulation process examines the number of absolute misses and the number of hits in each segment of the cache simulator. In this embodiment, the performance of a cache is indicated by the number of misses it incurred. Thus, an initial estimate (E) is generated for each cache by adding the number of absolute misses and the number of hits in each segment that is not part of the cache. Thus, $E_0=M+\text{Segment\_Hits}[1]+\text{Segment\_Hits}[2]+\ldots\text{Segment\_Hits}[7]$, $E_1=M+\text{Segment\_Hits}[2]+\text{Segment\_Hits}[3]+\ldots\text{Segment\_Hits}[7]$, and so on until $E_6= M+\text{Segment\_Hits}[7]$ and $E_7=M$.

A correction factor C is used in this embodiment to convert the initial estimates into final estimates (F). It will be recalled that one of the simulated caches in the embodiment of FIG. 2 (i.e., cache3, consisting of segments 0–3) matches the size of the operational buffer cache from which the data references used in the simulation were derived. And, the number of cache misses or physical reads incurred by the operational buffer cache for the data references is known. Therefore, correction factor C for this embodiment is equal to the number of actual misses incurred by the operational cache divided by the initial estimate, $E_3$, of misses for the same-sized simulated cache.

This correction factor is then applied, by multiplication, to each of the initial estimates to yield final estimates: $F_0=E_0*C, F_1=E_1C, \ldots F_7=E_7*C$. When the data references applied in the simulation faithfully mimic the actual references applied to the operational buffer cache, the final estimates are generally very accurate.

The results of a simulation conducted with simulator 200 have been shown to be accurate for predicting cache performance in an operational environment in which a variant of the LRU algorithm is used. Illustratively, a buffer cache employing this algorithm comprises a linked list of buffers. Each buffer stores a data item and a touch count representing the number of times the buffer has been touched or used since its current data item was stored. Each time a buffer is referenced its touch count is incremented. New buffers are inserted in the middle portion of the list rather than at one of the ends. When a miss occurs and a new buffer must be inserted, but no empty buffers exist, the list is scanned and a buffer that has a touch count greater than a threshold (or the buffer having the highest touch count) is moved to the head of the list and its touch count is reset to zero. A buffer having a touch count below the threshold (or the buffer having the lowest touch count) is replaced to make room for the new data.

Figure 4A:
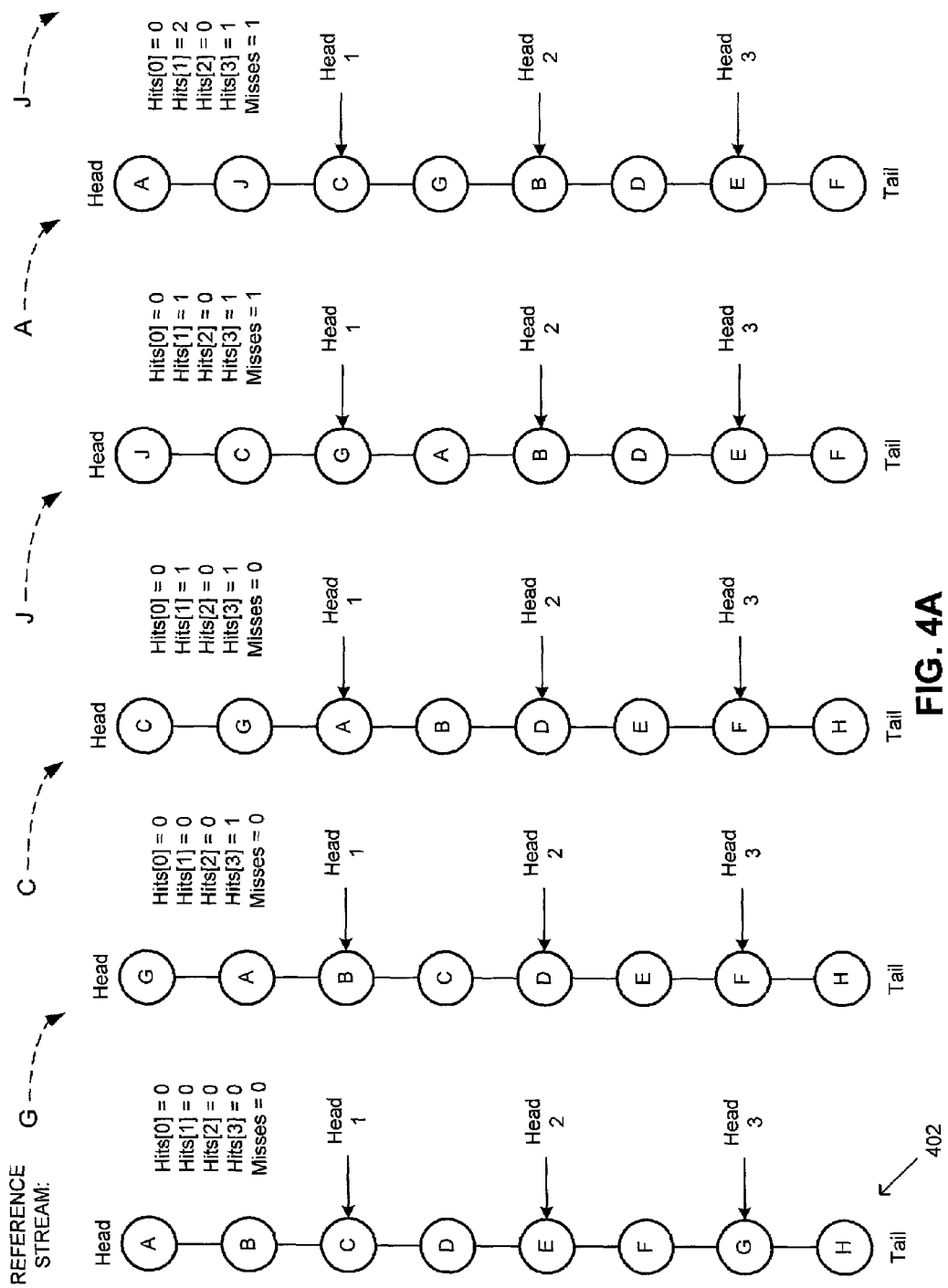
FIGS. 4A–4B depict the simulation of a stream of data references according to one embodiment of the invention.
Figure 4B:
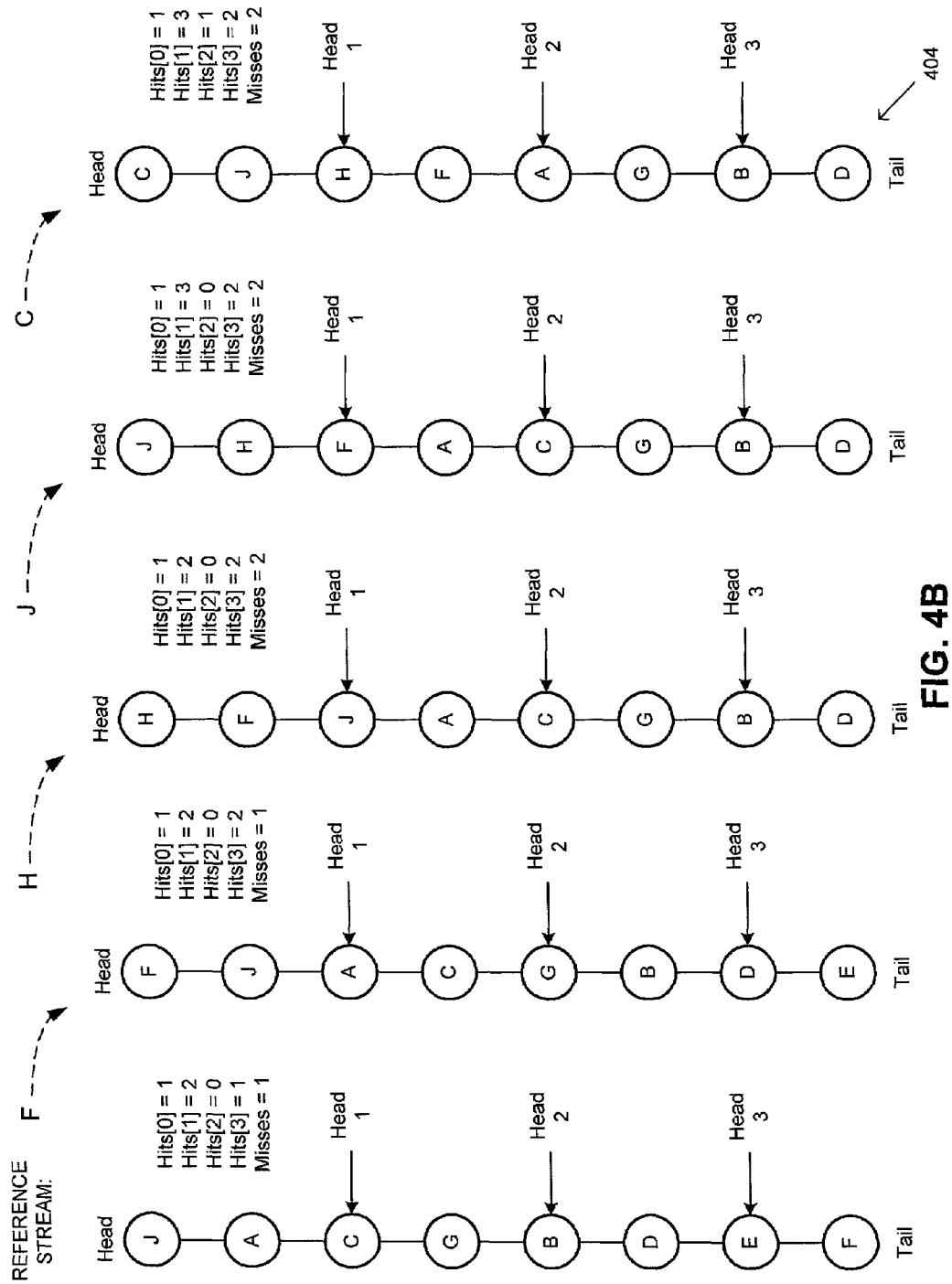

FIGS. 4A–4B demonstrate the use of a segmented cache simulator to simulate multiple caches with a LRU replacement policy, according to one embodiment of the invention. In the illustrated example, the simulator is initially configured as indicated by reference number 402, and comprises eight buffers populated with eight different data references. Four segments are defined; the head of the simulator also identifies the head of segment 0, while pointers identify the heads of segments 1, 2 and 3. The illustrated simulator can thus simulate the performance of caches of four different sizes, having two, four, six or eight buffers. An array for tallying the hits in each segment, and a counter of absolute misses, are zeroed. Successive depictions of the simulator in FIGS. 4A–4B demonstrate how the contents change as the indicated stream of data references is simulated.

For example, the first data reference ("G") is found in segment 3, thereby causing the counter of hits for segment 3 to be incremented. The buffer that holds this reference is unlinked and inserted at the head of the simulator, and the pointers to the heads of each segment are updated.

After the data references are applied, the simulator appears as indicated by reference numeral 404. The Hits array and the Miss counter can then be used to generate initial performance estimates for the different size caches that have been simulated. For example, an initial estimate for a cache consisting of just two buffers (corresponding to just segment 0) is that it would result in eight misses for nine references. This estimate is derived by summing the number of hits in each of segments 1–3 and adding the number of misses. For a cache of four buffers (corresponding to segments 0 and 1), an initial estimate is five misses, while cache sizes of six and eight are estimated to yield four and two misses respectively.

As described above, a correction factor may then be applied to yield final estimates. If, for example, the size of the operational buffer used when this reference stream was received was four buffers, and there were four actual misses during operational use of the buffer, then we calculate a correction factor of 0.8 (i.e., four actual misses divided by five simulated misses). This correction factor is then applied to each of the initial estimates to yield final estimates of 6.4 for two buffers, 3.2 for six buffers and 1.6 for eight buffers.

In one embodiment of the invention, if the final estimates from a cache simulation indicate that a cache of a different size would be more suitable (i.e., yield fewer misses), the system may automatically and dynamically adjust the size of the operational cache accordingly (e.g., without halting or restarting the DBMS or data processing environment).

Figure 3A:
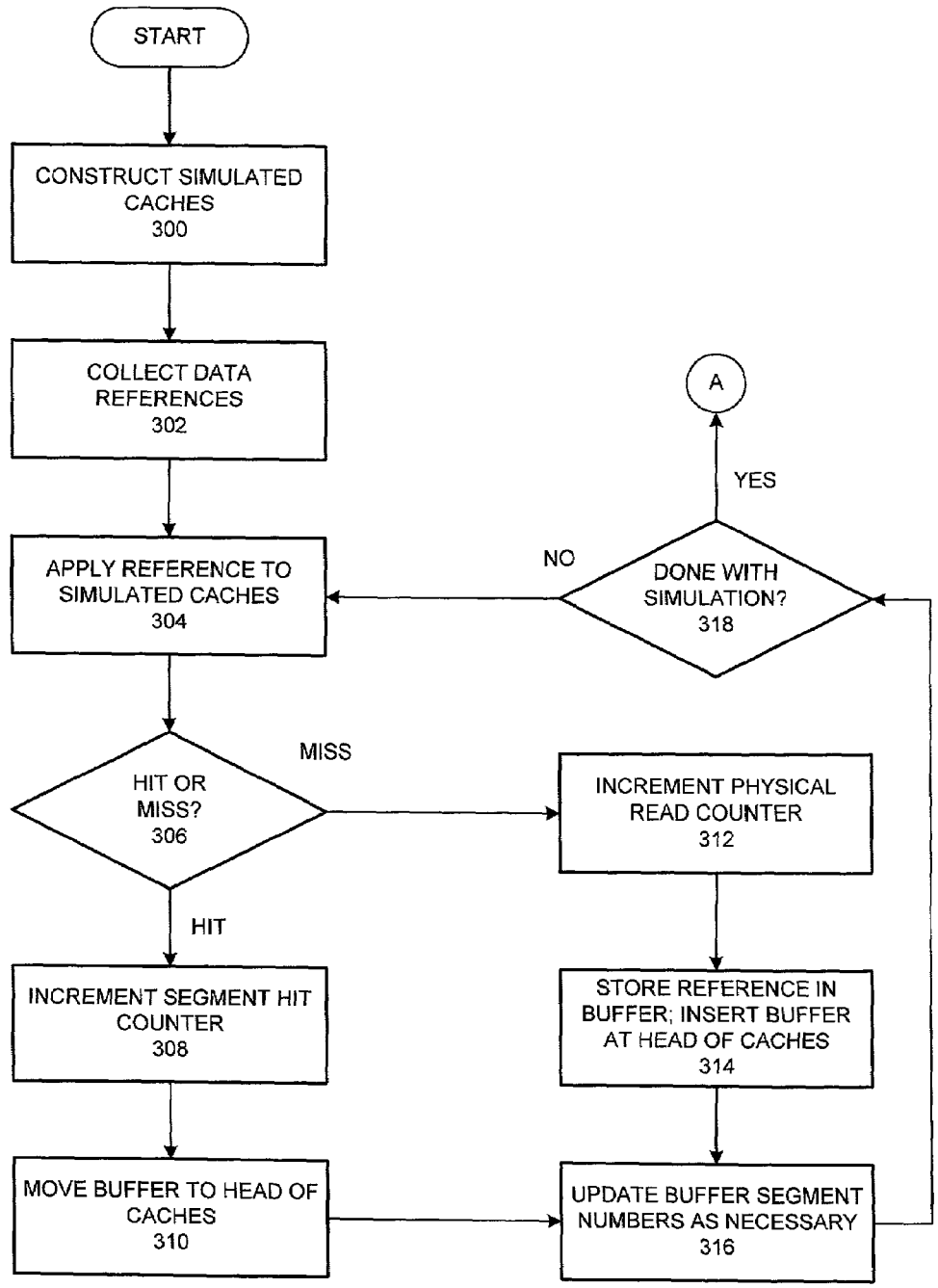
FIGS. 3A–3B comprise a flowchart demonstrating one method of predicting the performance of multiple caches, of different sizes, in accordance with an embodiment of the present invention.
Figure 3B:
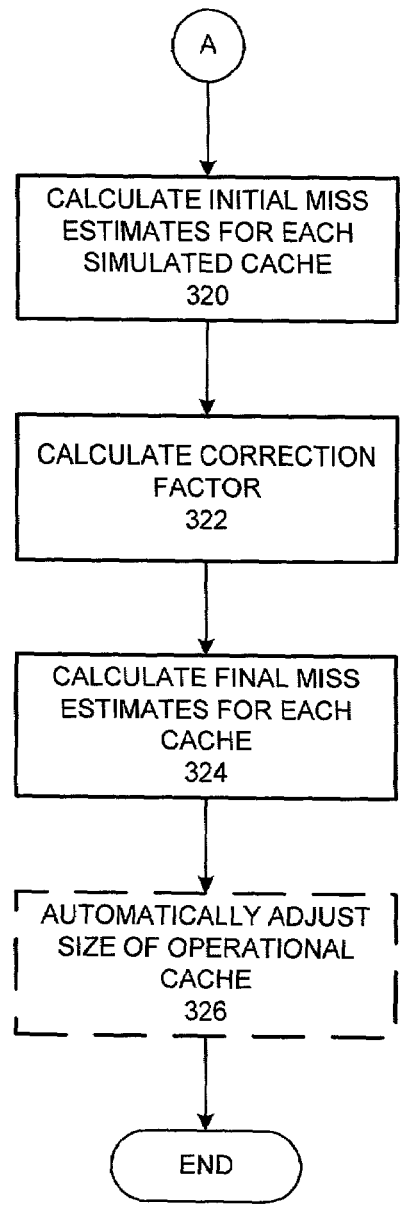

FIG. 3 is a flowchart demonstrating an illustrative method of simulating the performance of one or more caches according to one embodiment of the invention. This method is designed to estimate the caches' miss rates under an actual workload encountered by an operational cache, so that the simulated caches' performances can be compared to that of the operational cache. In this method, one of the simulated caches will be of the same size as the operational cache (i.e., contain a number of simulated buffers equivalent to the number of buffers in the operational cache).

In state 300, a cache simulator or simulated replacement list is constructed. The simulator comprises a plurality of segments, which may be of equal or unequal size. As described above, multiple caches of different sizes will be simulated by different groups of consecutive segments. Each buffer is initialized to store the number of the segment in which the buffer is initially positioned. As references to new data items are received, the buffers are populated with identifiers of the data (e.g., data block addresses).

In state 302 data references are collected. Illustratively, the references are copied from references received at the operational cache. The accuracy of the results of the simulation may be improved by taking enough references to reflect a typical workload. The collected data references may be stored in a trace buffer until a simulation is to be run or until a threshold number of references are collected, at which time the references may be applied to the cache simulator.

Thus, in state 304 a data reference is taken from the trace buffer and applied to the simulated caches. In particular, the cache simulator is searched for a buffer containing an identifier of or reference to the same data item.

In state 306 the simulation system determines whether the data reference was a hit or a miss. If it was a hit, the illustrated procedure continues at state 308. Otherwise, in the event of a miss the procedure advances to state 312.

In state 308, a counter is incremented for the number of hits in the segment containing the buffer that identified the data item. Illustratively, this segment can be identified by reading the buffer's segment number field. In state 310 the buffer is moved to the head of the cache simulator. The illustrated procedure then advances to state 316.

In state 312, the data reference was a miss in every segment and therefore a counter is incremented for the number of absolute misses. In state 314, an identifier of or reference to the data item is stored in a buffer (e.g., from the bottom or tail of the simulated replacement list) and that buffer is inserted at the head of the list.

In state 316, segment numbers are updated for all of the buffers that have moved into a different segment. Thus, the buffer just placed at the head of the simulated replacement list and all buffers that moved down one position to the head of the next segment are updated.

In state 318 the system determines whether the simulation is done. Each batch of data references taken from the trace buffer may comprise a separate simulation. Or, as in a present embodiment, references may be continually accumulated in and removed from the trace buffer until the end of a typical work cycle. If the simulation is not finished, then the illustrated procedure returns to state 304 to apply another data reference. Otherwise, the procedure continues at state 320.

In state 320, initial miss estimates are computed for each simulated cache. As described above, an initial estimate for a simulated cache may comprise the number of absolute misses plus any hits that were made in cache simulator segments that are not part of the simulated cache.

In state 322 a correction factor is calculated by dividing the number of misses or physical reads incurred by the operational cache for the set of data references by the initial estimate for the simulated cache that is of the same size as the operational cache.

In state 324 each initial miss estimate is multiplied by the correction factor to yield a final prediction of misses that an operational cache of the same size would incur.

In optional state 326, the size of the operational cache is automatically and dynamically adjusted to match the size of a simulated cache having a lower predicted miss rate than the actual miss rate incurred by the operational cache.

The foregoing descriptions of embodiments of the invention have been presented for purposes of illustration and description only. They are not intended to be exhaustive or to limit the invention to the forms disclosed. Accordingly, the above disclosure is not intended to limit the invention; the scope of the invention is defined by the appended claims.

What is claimed is:

1. A method of predicting cache performance, comprising:
   storing data references applied to an operational data cache in a data processing environment;
   applying said data references to a cache simulator configured to simultaneously simulate a plurality of caches of different sizes, wherein said cache simulator comprises multiple segments and each said simulated cache comprises one or more of said segments; and
   generating for each of said plurality of simulated caches an estimate of performance based on said simulation, wherein said generating comprises:
     for a first simulated cache in said plurality of simulated caches:
       calculating the number of hits in all segments of said cache simulator that do not comprise part of said first simulated cache,
       adding the number of said misses of all of said segments to said calculated number of hits to produce an initial estimated miss rate for said first simulated cache,
       calculating a correction factor to apply to said initial estimated miss rate for said first simulated cache, and
       multiplying said initial estimated miss rate for said first simulated cache by said correction factor to yield a predicted miss rate for said first simulated cache;
   wherein each application of one of said data references to said cache simulator causes either a hit in one of said segments or a miss of every said segment.

2. The method of claim 1, further comprising:
   dynamically adjusting the size of said operational data cache to match the size of one of said simulated caches.

3. The method of claim 1, wherein said data processing environment is a database management system and said operational data cache is a buffer cache configured to cache data in said database management system.

4. The method of claim 3, wherein said storing data references comprises:
   receiving a first data reference at said operational data cache;
   storing said first data reference in a trace buffer for use in said simulation of said plurality of caches if said trace buffer is not full; and
   discarding said first data reference if said trace buffer is full.

5. The method of claim 1, wherein said cache simulator comprises a list of simulated buffers, and each said simulated buffer is configured to store:
   an identifier of a data item; and
   an identifier of said segment of said cache simulator in which said simulated buffer is located.

6. The method of claim 5, wherein said applying comprises:
   retrieving a first stored data reference;
   identifying a first data item referenced in said first data reference; and
   searching said cache simulator for a buffer in which an identifier of said first data item is stored.

7. The method of claim 6, further comprising:
   if a first buffer is found in said cache simulator that stores an identifier of said first data item:
     incrementing a hit counter for said segment in which said first buffer is found;

moving said first buffer to a head of said cache simulator; and updating said stored segment identifiers of said buffers as necessary.

8. The method of claim 6, further comprising:

if no buffer is found in said cache simulator that stores an identifier of said first data item:

incrementing an absolute miss counter;

storing an identifier in a first buffer in said cache simulator;

moving said first buffer to a head of said cache simulator; and updating said stored segment identifiers of said buffers as necessary.

9. The method of claim 1, wherein said correction factor comprises the ratio of misses incurred during application of said data references to said operational data to an initial estimated miss for a second simulated cache in said plurality of simulated caches;

wherein the number of buffers in said second simulated cache matches the number of buffers in said operational data cache.

10. A method of simulating the performance of multiple caches of different sizes, comprising:

storing references to data items received during operation of a database management system;

maintaining a multi-segmented cache simulator comprising simulated buffers configured to store data identifiers, wherein each of said multiple caches comprises a set of said segments different from the other caches;

for each of said stored references:

searching said cache simulator for a first simulated buffer storing an identifier of said referenced data item;

if said first simulated buffer is found in said segmented memory:

incrementing a hit counter for said segment in which said first simulated buffer is located; and moving said simulated cached reference to the head of said segmented memory;

if no simulated buffer storing an identifier of said referenced data item is found in said cache simulator:

incrementing a miss counter;

storing an identifier of said data item in a second simulated buffer; and storing said second simulated buffer at a head of said cache simulator; and generating an estimate of the performance of each of said multiple caches.

11. The method of claim 10, wherein said estimated performance comprises a number of misses, wherein said generating comprises:

for a first cache of said multiple caches, calculating the number of said referenced data items for which identifiers were not found in the cache simulator segments comprising said first cache.

12. The method of claim 11, further comprising:

calculating a predicted number of misses for said first cache by multiplying said estimated performance for said first cache by a correction factor.

13. The method of claim 12, wherein:

said data item references are received at an operational cache of said database management system and result in a known number of misses in said operational cache;

a second cache of said multiple caches comprises a number of simulated buffers equivalent to the number of buffers comprising said operational cache; and said correction factor is equal to the ratio of said known number of misses to said estimated performance for said second cache.

14. The method of claim 13, further comprising:

dynamically altering the size of said operational cache to the size of said first cache, wherein said predicted number of misses for said first cache is less than said known misses in said operational cache.

15. The method of claim 10, wherein said storing comprises:

receiving a first reference to a data item at said database management system;

if a trace memory configured to store said first reference is full, discarding said first reference; and otherwise, storing said first reference in said trace memory without locking said trace memory.

16. The method of claim 10, wherein said data item references are received at an operational cache of said database management system, further comprising:

identifying the number of operational cache misses resulting from application of said data item references to said operational cache; and dynamically altering the size of said operational cache to the size of one of said multiple caches having a superior estimated performance.

17. A computer readable storage medium storing instructions that, when executed by a computer, cause the computer to perform a method of predicting cache performance, the method comprising:

storing data references applied to an operational data cache in a data processing environment;

applying said data references to a cache simulator configured to simultaneously simulate a plurality of caches of different sizes, wherein said cache simulator comprises multiple segments and each said simulated cache comprises one or more of said segments; and generating for each of said plurality of simulated caches an estimate of performance based on said simulation, wherein said generating comprises:

for a first simulated cache in said plurality of simulated caches:

calculating the number of hits in all segments of said cache simulator that do not comprise part of said first simulated cache, adding the number of said misses of all of said segments to said calculated number of hits to produce an initial estimated miss rate for said first simulated cache, calculating a correction factor to apply to said initial estimated miss rate for said first simulated cache, and multiplying said initial estimated miss rate for said first simulated cache by said correction factor to yield a predicted miss rate for said first simulated cache;

wherein each application of one of said data references to said cache simulator causes either a hit in one of said segments or a miss of every said segment.

* * * * *

UNITED STATES PATENT AND TRADEMARK OFFICE
CERTIFICATE OF CORRECTION

PATENT NO. : 6,952,664 B1
DATED : October 4, 2005
INVENTOR(S) : Tirthankar Lahiri It is certified that error appears in the above-identified patent and that said Letters Patent is hereby corrected as shown below:

Column 11,
Line 17, please delete the phrase "data to" and replace with the phrase -- data cache to --.
Line 19, please delete the phrase "miss for" and replace with the phrase -- miss rate for --.

Signed and Sealed this

Sixth Day of December, 2005

JON W. DUDAS
*Director of the United States Patent and Trademark Office*